(12) United States Patent
Kampf

(10) Patent No.: US 6,281,816 B1
(45) Date of Patent: Aug. 28, 2001

(54) METHOD AND APPARATUS FOR REDUCING DATA EXPANSION DURING DATA COMPRESSION

(75) Inventor: Francis A. Kampf, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/379,864

(22) Filed: Aug. 24, 1999

(51) Int. Cl.$^7$ ........................................ H03M 7/00
(52) U.S. Cl. ................................. 341/87; 341/51
(58) Field of Search .......................... 341/51, 87

(56) References Cited

U.S. PATENT DOCUMENTS

| | | | |
|---|---|---|---|
| 3,394,352 | * 7/1968 | Wernikoff et al. | 341/67 |
| 4,870,415 | * 9/1989 | Van Maren et al. | 341/94 |
| 5,049,881 | 9/1991 | Gibson et al. . | |
| 5,177,480 | * 1/1993 | Clark | 341/51 |
| 5,353,024 | 10/1994 | Graybill . | |
| 5,686,912 | 11/1997 | Clark, II et al. . | |
| 6,008,743 | * 12/1999 | Jacquette | 341/51 |

* cited by examiner

Primary Examiner—Howard L. Williams
(74) Attorney, Agent, or Firm—Schmeiser, Olsen & Watts; Robert A. Walsh

(57) ABSTRACT

A method and apparatus for reducing data expansion during data compression are provided that allow the coding scheme used to compress data to be swapped between two or more coding schemes. Specifically, a coding window is provided that holds data to be compressed, and the compression potential of data entering or exiting the coding window is calculated. When a first threshold compression potential sum of data entering the window is reached, the coding scheme used to compress the data within the coding window is swapped from one coding scheme to another. A new compression potential sum is set based upon the compression potential of data exiting the window. The compression potential sum comprises a running total of the compression potential of data entering the coding window; and the coding scheme used to compress data within the coding window is swapped from one coding scheme to another when the compression potential sum reaches a first predetermined value. Preferably the first predetermined value is programmable and is related to the bit cost required to swap back and forth between coding schemes. The two preferred coding schemes are ALDC Lempel-Ziv 1 coding and a pass-through coding scheme wherein raw data is passed unencoded. A coding window circuit also is provided that allows analysis of the compression potential of data in accordance with the above method.

23 Claims, 9 Drawing Sheets

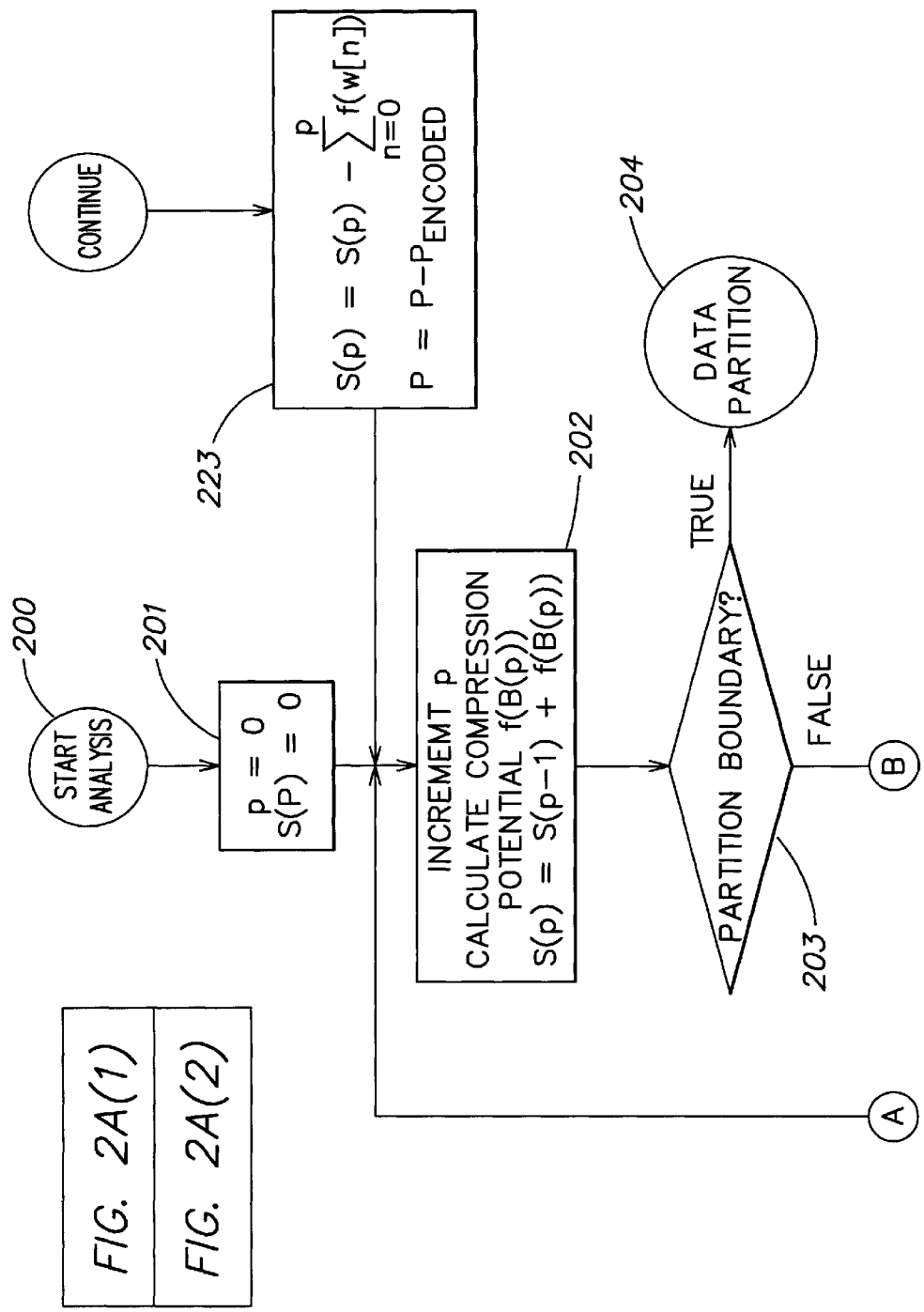
FIG. 2A(1)

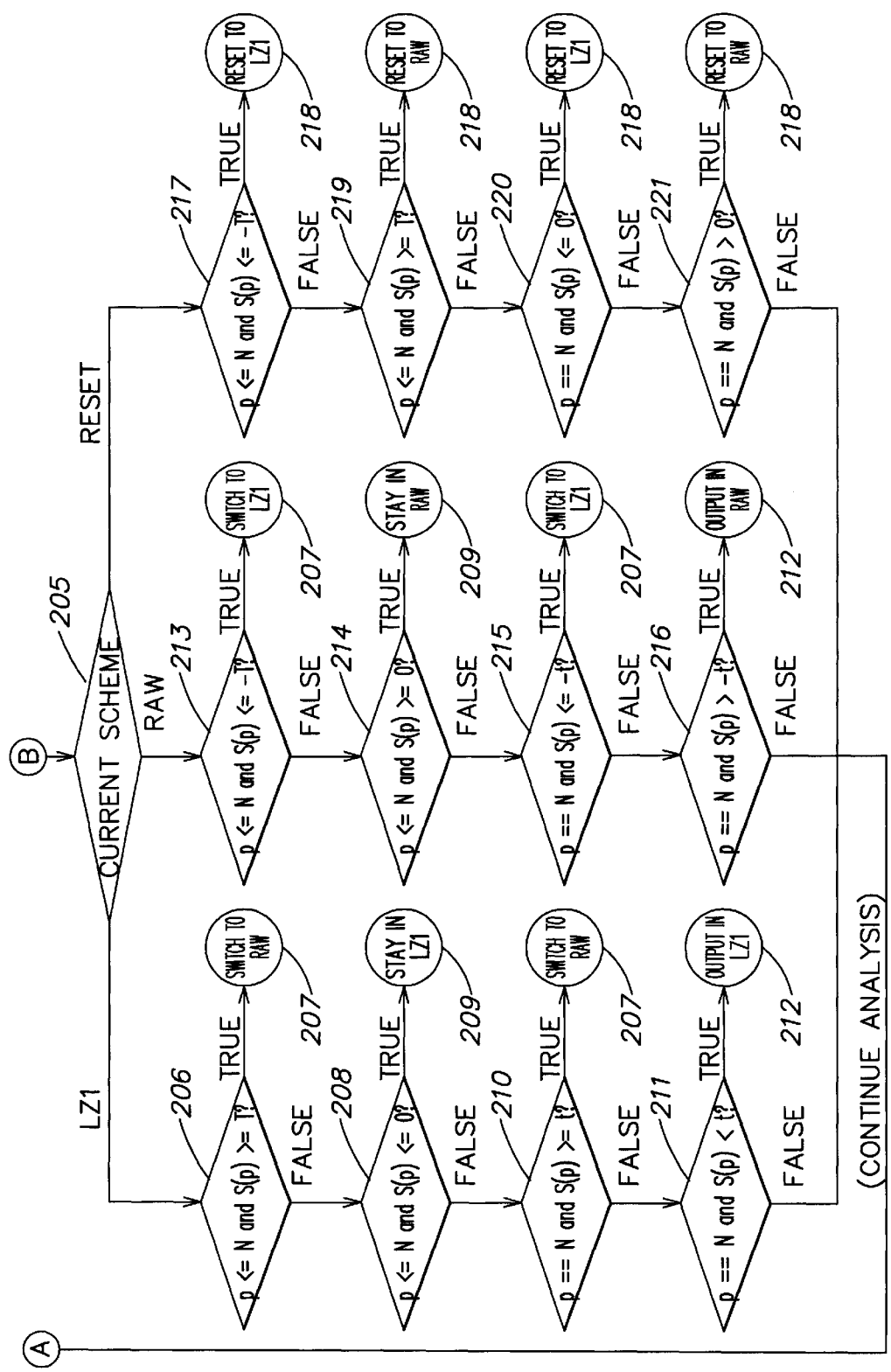
FIG. 2A(2)

METHOD AND APPARATUS FOR REDUCING DATA EXPANSION DURING DATA COMPRESSION

CROSS-REFERENCE TO RELATED APPLICATIONS

The present application is related to commonly assigned U.S. patent application Ser. No. 09/379,821, filed on even date herewith which is hereby incorporated by reference herein in its entirety.

FIELD OF THE INVENTION

The present invention relates to data compression schemes, and more particularly to a method and apparatus for reducing the expansion of data during data compression.

BACKGROUND OF THE INVENTION

The use of data compression or "coding" schemes to increase the storage capacity of storage media (e.g., tape drives, hard drives, etc.) is well known in the art, and can result in significant increases in data storage capacity. However, the efficiency with which data may be compressed depends on the specifics of the compression scheme employed and the type of data compressed. Depending on data entropy, certain data types may be incompressible or inefficiently compressible by the compression scheme, and may cause the data to occupy more memory space than when the data is in an uncompressed format (i.e., data expansion). For example, in many implementations of Lempel-Ziv 1 coding including IBM's adaptive lossless data compression (ALDC), LZS (QIC 122), etc., highly random data can expand in size up to 12.5% (e.g., from 60,000 bytes uncompressed to 67,500 bytes compressed).

When data expansion occurs during data compression, the very purpose of performing data compression (e.g., to increase the storage capacity of a storage media) is subverted. Accordingly, a need exists for a method and apparatus for reducing the expansion of data during data compression.

SUMMARY OF THE INVENTION

To overcome the needs of the prior art, a method and apparatus are provided for reducing data expansion during data compression that determine when the coding scheme used to compress data should be swapped between two or more coding schemes. Specifically, a coding window is provided that holds data to be compressed, and the compression potential of data entering or exiting the coding window is calculated. When a compression potential sum of data entering the window reaches a first predetermined value (e.g., when a first threshold compression potential sum of data entering the window is reached), the coding scheme used to compress the data within the coding window is swapped from one coding scheme to another (e.g., the coding scheme used to compress the data within the coding window is swapped to a new coding scheme and the data within the coding window is then compressed using the new coding scheme). A new compression potential sum is set based upon the compression potential of data exiting the window.

The compression potential sum comprises a running total of the compression potential of data entering the coding window; and the coding scheme used to compress data within the coding window is swapped from one coding scheme to another when the compression potential sum reaches a first predetermined value (e.g., the first threshold compression potential sum). As used herein, "reaches a predetermined value" means has an absolute magnitude greater than or equal to an absolute magnitude of the predetermined value. Preferably the first predetermined value is programmable and is related to the bit cost required to swap back and forth between coding schemes. The two preferred coding schemes are ALDC Lempel-Ziv 1 (hereinafter "LZ1") coding and a pass-through (hereinafter "RAW") coding scheme wherein raw data is passed unencoded.

If the end of the coding window is reached before the first predetermined value is reached, swapping of the coding scheme used to compress the data within the coding window preferably is performed if the compression potential sum reaches a second predetermined value.

A coding window circuit also is provided that allows analysis of the compression potential of data in accordance with above described method. The coding window circuit includes a coding window buffer adapted to store data bytes supplied to the coding window circuit, and a first calculation circuit coupled to the coding window buffer and adapted to compute the compression potential of a data byte entering or exiting the coding window buffer. As used herein, coupled means coupled directly or indirectly so as to operate. A second calculation circuit coupled to the first calculation circuit is adapted to compute a compression potential sum based on the computed compression potentials of a plurality of data bytes stored within the buffer. A comparison circuit is coupled to the second calculation circuit and is adapted to compare the computed compression potential sum to a first predetermined value and to generate a signal that swaps the coding scheme used to compress data bytes within the buffer from one scheme to another if the computed compression potential sum is greater than or equal to the first predetermined value. A third calculation circuit is coupled to the second calculation circuit and is adapted to adjust the compression potential sum based on the compression potential of at least one data byte exiting the coding window buffer.

By thus analyzing the compression potential of data prior to coding, and by selecting an appropriate coding scheme based thereon, data compression may be performed with the potential for minimal data expansion. Because the compression potential sum is set to a new compression potential sum (e.g., is adjusted) based upon the compression potential of data exiting the coding window, the inventive coding selection algorithm may be easily implemented in hardware.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
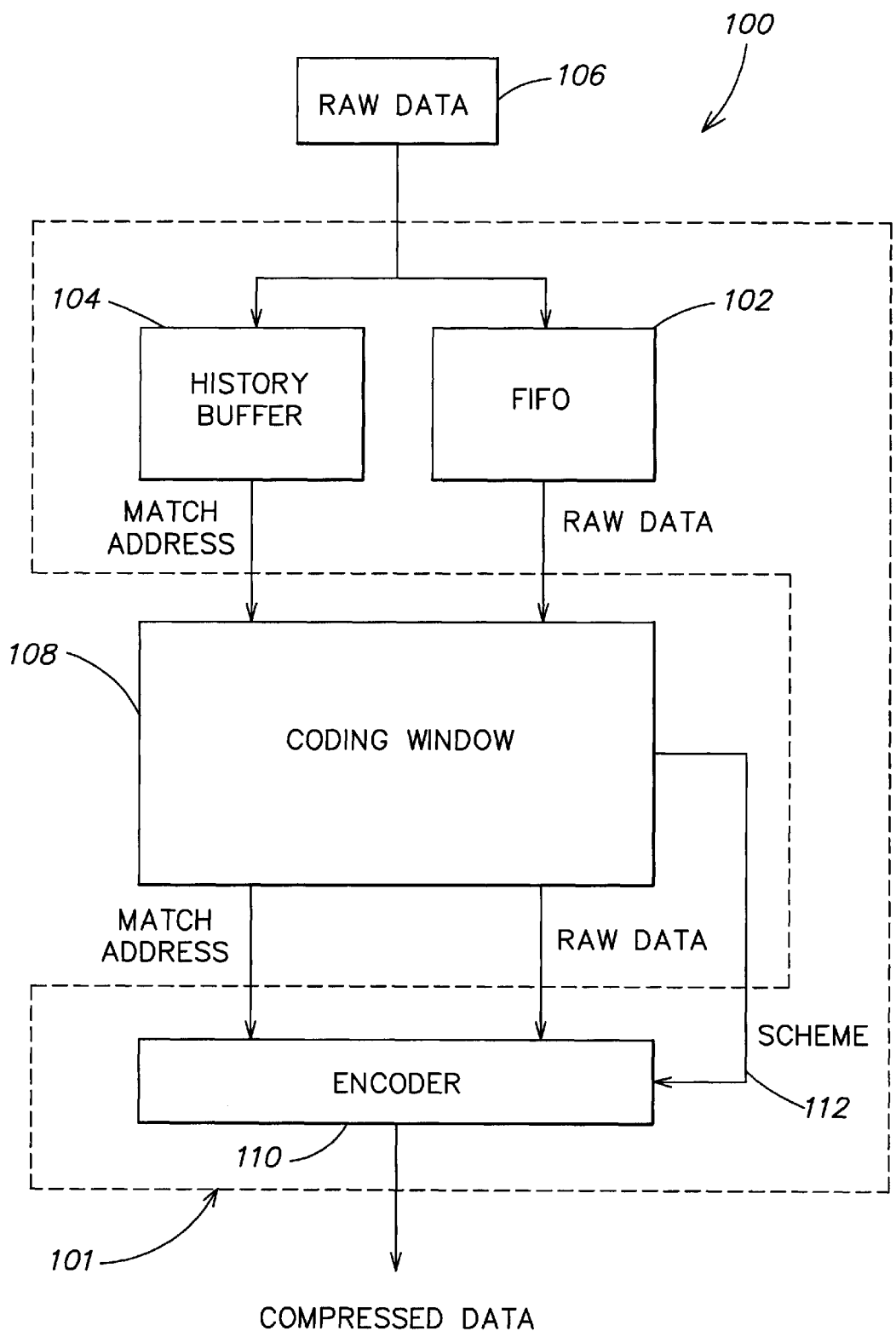
FIG. 1 is a block diagram of an inventive data compression system for coding data while reducing potential data expansion in accordance with the present invention.

FIG. 1 is a block diagram of an inventive data compression system 100 for coding data while reducing potential data expansion in accordance with the present invention. The inventive system 100 is described herein with reference to ALDC Lempel-Ziv 1 (LZ1) coding and a typical hardware implemented LZ1 encoder circuit 101. However, it will be understood that the invention may be employed with other coding schemes and with other encoder embodiments (e.g., software based encoder embodiments).

The inventive data compression system 100 comprises a first-in first-out (FIFO) buffer 102 and a history buffer 104 coupled to a source of unencoded or "raw" data bytes (e.g., raw data byte source 106), a coding window 108 coupled to both the FIFO buffer 102 and the history buffer 104, and an encoder 110 coupled to the coding window 108. The raw data byte source 106 may comprise any conventional data source such as a tape drive, a CD-ROM, a hard disk or the like. The FIFO 102, the history buffer 104 and the encoder 110 form the hardware encoder circuit 101 as shown.

The history buffer 104 comprises a random access memory (RAM) that stores one 8-bit ASCII character per address and preferably is 512 bytes, 1 kilobyte or 2 kilobytes in size. As described below, the history buffer 104 receives raw data bytes from the raw data byte source 106, generates "history" information for each received data byte (e.g., a match address) and outputs each data byte's history information to the coding window 108. Because of the time required to generate history information for each data byte supplied from the raw data byte source 106, the FIFO buffer 102 introduces a delay to the raw data byte stream supplied from the raw data byte source 106 to the coding window 108 so that each data byte supplied from the raw data byte source 106 arrives at the coding window 108 at the same time as the history information for the data byte (e.g., generated by the history buffer 104).

As described further below with reference to FIGS. 2–4, the coding window 108 comprises an inventive coding selection algorithm implementable in either hardware, software or a combination thereof, but specially adapted for hardware implementations. The inventive coding selection algorithm examines subsets of the raw data bytes supplied from the FIFO buffer 102 and the history information supplied from the history buffer 104 to affect coding of the raw data byte stream supplied from the raw data byte source 106 with minimal data expansion. Specifically, subsets of raw data bytes preferably having a maximum size of 32, 64 or 128 data bytes (e.g., by employing a 32, 64 or 128 byte coding window) are examined employing the inventive algorithm to determine whether, on average, the raw data bytes within each subset require fewer bits if coded using LZ1 coding or if left as a raw data bytes (i.e., if coded using a pass-through or "raw" coding scheme that merely passes the raw data bytes through the encoder 110 unencoded. Based on this coding efficiency determination, the coding window 108 issues a scheme selection signal ("scheme") to the encoder 110 (e.g., via a scheme selection control line 112) to select either LZ1 coding or raw coding for each data byte subset. Note that the size of each data byte subset coded may be less than or equal to the size of the coding window 108.

To understand the operation of the inventive coding selection algorithm, it is first necessary to understand LZ1 coding. Accordingly, LZ1 coding is now briefly described.

The LZ1 compression algorithm compresses data within a data stream comprising data bytes of 1-byte "characters" (e.g., 8-bit ASCII code) by examining the data stream for repeated sequences of characters. If repeated sequences of characters are identified, the address within the history buffer 104 of the first occurrence of the repeated sequences of characters (i.e., the displacement) and the number of characters in the repeated sequence (i.e., the length) are output in place of all but the first occurrence of the repeated sequence of characters.

In accordance with the LZ1 compression algorithm, each non-repeated character is coded as a raw data byte termed a "literal", and each repeated character sequence other than the first occurrence of the repeated character sequence is coded as a "copy pointer" comprising the displacement and length values for the first occurrence of each repeated sequence of characters.

When a data byte is coded as a literal, an extra bit (e.g., 0) is added to the data byte to identify the data byte as a literal. Similarly, when a repeated sequence of characters is coded as a copy pointer, an extra bit (e.g., 1) is added to the length and displacement information for the repeated sequence to identify the information as a copy pointer.

The extra bit added to raw data bytes to identify the bytes as literals effectively expands the size of each raw data byte by one bit. Thus, in a highly random data stream (e.g., a data stream having relatively few repeated sequences of characters) data expansion can result from LZ1 data coding. In the worst case situation with no repeated sequences of characters, the effective size of the data stream may expand by 12.5%. The inventive data compression system 100 avoids this form of data expansion.

In general, the inventive data compression system 100 avoids data expansion during LZ1 coding of a data stream by analyzing the data stream as a series of data subsets. A determination is made whether the data bytes within each subset are more efficiently compressed by using the LZ1 coding scheme or by using the RAW coding scheme which passes the raw data bytes in an uncoded format (e.g., a format that does not require an extra bit to identify a raw data byte as a literal). In this manner, highly random data is not compressed and data expansion (due to the extra bit that identifies raw data bytes as literals within the LZ1 coding scheme) is avoided.

With reference to FIG. 1, a data stream comprising a plurality of data bytes is transferred byte-by-byte from the raw data byte source 106 to the history buffer 104, and to the coding window 108 via the FIFO buffer 102. For each data byte the history buffer 104 receives from the raw data byte source 106, in addition to storing the data byte, the history buffer 104 outputs a match address (e.g., the displacement value of any matching data byte) to the coding window 108. The inventive coding selection algorithm then uses this information to determine the most efficient coding scheme for compressing the data supplied from the raw data byte source 106.

To determine the most efficient coding scheme to employ, the "benefit" of compressing each data byte received from the raw data byte source 106 (i.e., the compression potential of each data byte received from the raw data byte source 106) is numerically quantified and is added to a "compression potential sum". The compression potential sum represents the overall benefit of compressing all of the data bytes whose compression potentials comprise the compression potential sum. In general, if the compression potential sum exceeds a predetermined value (e.g., the "cost" of switching back and forth between coding schemes as described below), then the data bytes that contributed to the compression potential sum are coded with a first coding scheme (e.g., LZ1 or RAW); otherwise, a second coding scheme is employed to code the data bytes (e.g., RAW or LZ1), as described below with reference to FIGS. 2–4. The maximum number of data bytes that contribute to the compression potential sum is set by the size of the coding window 108.

Figure 2B:
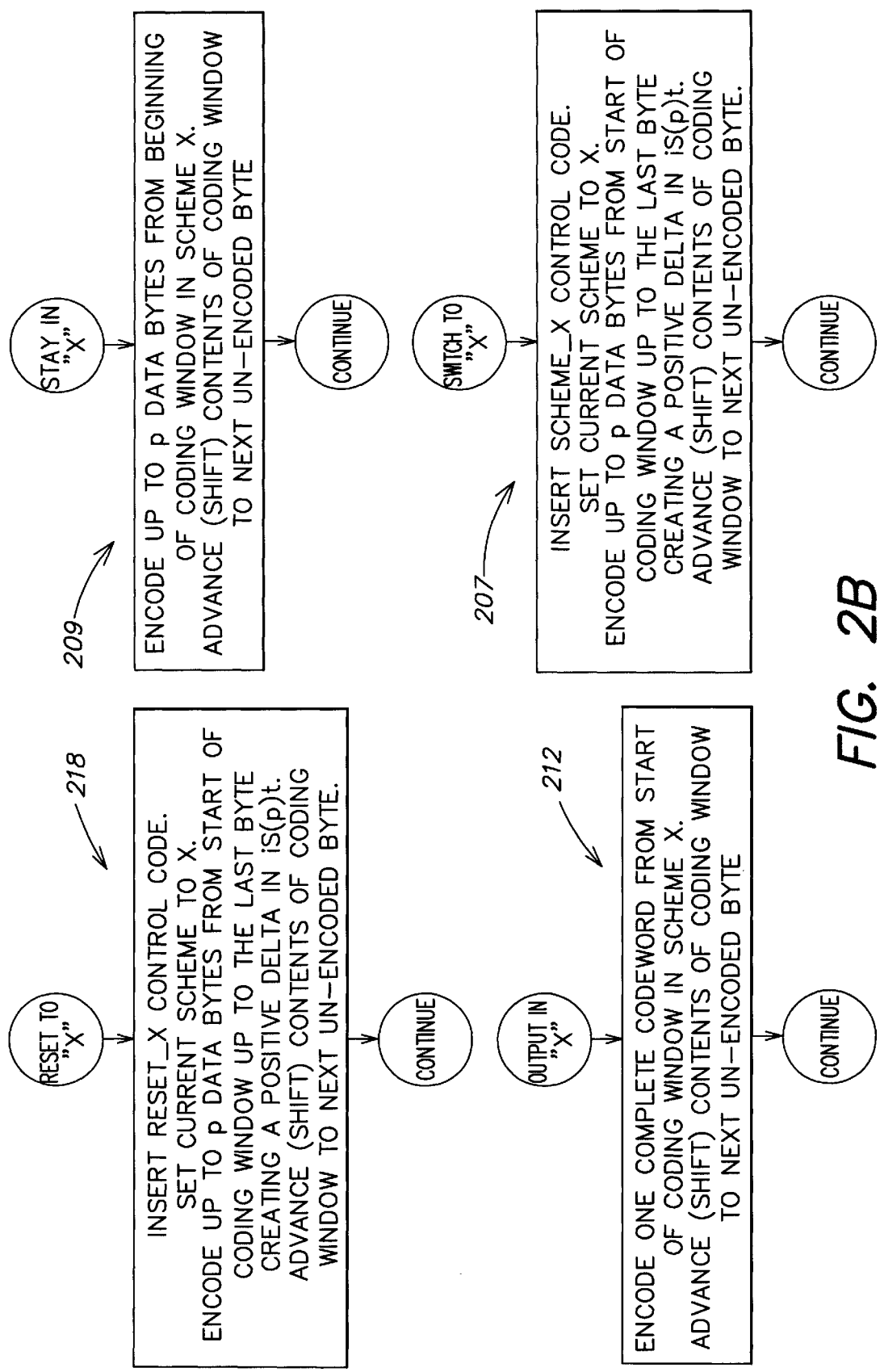
FIGS. 2A(1), 2A(2) and 2B are a flowchart of an inventive coding selection algorithm's general operation.

FIG. 2 is a flowchart of the inventive coding selection algorithm's general operation. The inventive coding selection algorithm starts at step 200. Thereafter, in step 201, a data byte pointer (p) is set to zero, as is the compression potential sum (S(p)).

In step 202, a data byte is obtained from the raw data byte source 106 and becomes part of the coding window 108, and the data byte pointer (p) is incremented by one. The compression potential f(B(p)) of the data byte then is computed, as described below with reference to FIG. 4, and is added to the compression potential sum S(p). The compression potential sum S(p) thus represents the overall compression potential for the data bytes within the coding window 108.

In step 203, a determination is made as to whether all data bytes within the raw data byte source 106 have been analyzed (e.g., whether the end of a data partition has been reached). If so, subroutine 204 is invoked as described below with reference to FIG. 3; otherwise, control passes to step 205.

In step 205, the most recently employed coding scheme (i.e., the current coding scheme) is identified. If the current coding scheme is LZ1 coding, the branch containing steps 206–211 is traversed; if the current coding scheme is RAW coding the branch containing steps 213–216 is traversed; and if the current coding scheme is unknown (e.g., at system startup) the branch containing steps 217–221 is traversed.

With reference to steps 206–211 (e.g., assuming the current coding scheme is LZ1 coding), data byte pointer (p) and the compression potential sum S(p) are examined to determine if the data byte pointer (p) is less than or equal to the maximum number (N) of data bytes allowed within the coding window (e.g., 32, 64 or 128 bytes) and if the compression potential sum S(p) is greater than or equal to a first predetermined threshold (T) for swapping coding schemes.

The first threshold (T) preferably is based on the "cost" (in terms of extra bits) required to swap from one coding scheme to another coding scheme and back again. In the preferred implementation of the LZ1 coding scheme, control commands are represented by 12 bits plus an additional bit (e.g., 1) which identifies the control command as a control command. Therefore, the effective cost of swapping from one coding scheme to another is the 13 bits required to issue a control command that executes the swapping operation. The preferred first threshold (T) equals the cost of switching from one coding scheme to another, and then back again, for a total cost of 26 bits. The preferred first threshold (T), therefore, is 26. Preferably, the first threshold (T) is programmable.

The first threshold (T) may be positive or negative, depending on the current coding scheme. For example, as described further below with reference to the preferred embodiment of FIG. 2, when the current coding scheme is LZ1 coding and the compression potential sum S(p) reaches +26, the current coding scheme is swapped to RAW coding. Similarly, when the current coding scheme is RAW coding and the compression potential sum S(p) reaches −26, the current coding scheme is swapped to LZ1 coding.

With reference to step 206, if the data byte pointer (p) is less than or equal to N and the compression potential sum S(p) is greater than or equal to the first threshold (T) (e.g., +26), then it is more efficient to code the data within the coding window 108 by employing RAW coding. Subroutine 207 is invoked to swap coding schemes accordingly and to thereafter code the data within the coding window 108 using RAW coding.

Subroutine 207, in general, swaps the current coding scheme to a coding scheme "X" (e.g., either to LZ1 from RAW, or to RAW from LZ1). To swap coding schemes, the control code for switching to the desired coding scheme (e.g., SCHEME_X) is inserted in front of the data byte stream comprising the coding window 108. Thereafter, with the coding scheme set to X, the data bytes within the coding window 108 are coded (e.g., by supplying the appropriate scheme selection signal to the encoder 110 via the scheme selection control line 112) using coding scheme X, up to the last data byte creating a positive delta in the absolute value of the compression potential sum S(p). That is, up to the last data byte having a compression potential f(B) of the same sign as the other data bytes to be coded with coding scheme X. The contents of the coding window 108 then are shifted to the next un-encoded data byte supplied from the raw data byte source 106. In previously incorporated U.S. patent application Ser. No. 09/379,821, filed Aug. 24, 1999 after the contents of the coding window 108 are shifted to the next unencoded data byte supplied from the raw data byte source 106, the subroutine 207 ends by returning to step 200 to begin the compression potential analysis of a new set of data within the coding window 108. While well suited for software implementations, such a feature forces the unencoded analyzed contents of the coding window 108 to be re-analyzed after each coding selection decision is made. Accordingly, access to the compression potential f(B) of each entry within the coding window 108 is required to perform the re-analysis, increasing the hardware design complexity of the coding window 108 as the coding window size is increased.

To avoid the repeated analysis of unencoded bytes contained within the coding window 108, after each coding selection decision (e.g., switch to "x" in subroutine 207 as described above, and stay in "x" in subroutine 209, output in "x" in subroutine 212 and reset to "x" in subroutine 218 as described below), in step 223, the compression potential sum S(p) is "adjusted" for the encoded data that leaves the coding window 108 and analysis continues from the last byte analyzed in step 202. That is, the compression potential f(B) of each encoded data byte is effectively subtracted from the compression potential sum S(p) (as represented by:

$$S(p) = S(p) - \sum_{n=0}^{p} f(w[n])$$

in step 223), the data byte pointer/coding window count (P) is adjusted for each data byte leaving the coding window (as represented by P−P$_{ENCODED}$ in step 223) and compression potential sum analysis continues in step 202. For example, during an output in x operation (subroutine 212), the compression potential f(B) of each data byte exiting the coding window 108 (e.g., compression potential f(O)) preferably is re-computed and is subtracted from the compression potential sum S(p) as the data byte exits the coding window 108. During a switch to x operation (subroutine 207), a stay in x operation (subroutine 209) or a reset to x operation (subroutine 218), preferably a compression potential sum adjustment factor (e.g., $S_{fav}$ or $S_{-fav}$, described below with reference to FIG. 6 and representative of the compression potential sum of up to p data bytes that were encoded from the start of the coding window to the last byte creating a positive delta in the absolute value of the compression potential sum S(p)) is subtracted from the compression potential sum S(p) as data bytes exist the coding window 108. In this manner, the compression potential of each data byte remaining within the coding window 108 need not be re-analyzed following a coding selection decision, and the inventive coding selection algorithm may be easily implemented in hardware as described below with reference to FIGS. 5 and 6.

Assuming the compression potential sum S(p) is less than the first threshold (T), in step 208, if the data byte pointer (p) is less than or equal to N and the compression potential sum S(p) is less than or equal to zero, then it is more efficient to code the data within the coding window 108 using the current LZ1 coding scheme. Subroutine 209, therefore, is called to perform the LZ1 coding.

Subroutine 209, in general, codes data within the coding window 108 employing the current coding scheme "X" (e.g., either LZ1 or RAW). Specifically, the p data bytes within the coding window 108 are coded using the current coding scheme X, and the contents of the coding window 108 are shifted to the next un-encoded data byte supplied from the raw data byte source 106. The subroutine 209 ends by adjusting the compression potential sum S(p) for the data that leaves the coding window 108 and is encoded (step 223) and by returning to step 202 to continue the compression potential analysis of data within the coding window 108.

Assuming the compression potential sum S(p) is greater than zero, in step 210, if the data byte pointer (p) equals N (e.g., if the end of the coding window 108 has been reached), the compression potential sum S(p) is examined to determine if it has reached a second predetermined threshold (t) for swapping coding schemes. The second threshold (t) represents an "educated guess" as to whether to swap coding schemes based on the data bytes within the coding window 108 when the end of the coding window 108 is reached. Typically, the closer the compression potential sum S(p) is to the first threshold (T), the more educated a decision it is to adopt the coding scheme designated by the first threshold (T) (e.g., RAW coding for +26, LZ1 coding for −26). The preferred value for second threshold (t) is about ⅔ of the first threshold (T), or about +/−17.

Returning to step 210, if when the end of the coding window 108 is reached (e.g., p=N) the compression potential sum S(p) equals or exceeds the second threshold (t), subroutine 207 is called to swap coding schemes from LZ1 to RAW, the data within the coding window 108 is coded, the compression potential sum S(p) is adjusted in step 223 as previously described, and compression potential analysis continues at step 202. However, if either the end of the coding window 108 or the second threshold (t) has not been reached, control passes to step 211.

In step 211, if the data byte pointer (p) equals N (e.g., if the end of the coding window 108 has been reached), and the compression potential sum S(p) is less than the second threshold (t), the data within the coding window 108 is encoded using LZ1 coding by calling subroutine 212 (described below); otherwise, because the compression potential sum S(p) has not reached the second threshold (t) at the end of the coding window 108 or has not reached the first threshold (T), or is not equal to or less than zero, analysis of the compression potential of the data bytes output from the raw data byte source 106 is continued at step 202.

The subroutine 212, in general, is similar to the subroutine 209. However, unlike the subroutine 209 which encodes p data bytes from the beginning of the coding window 108, the subroutine 212 encodes only one complete codeword from the start of the coding window 108 in the current scheme X, and the contents of coding window 108 are shifted to the next un-encoded data byte supplied from the raw data byte source 106. The subroutine 212 ends by adjusting the compression potential sum S(p) (step 223) and by returning to step 202 to continue the compression potential analysis of the data within the coding window 108.

Returning to step 205, if the current coding scheme is RAW, the branch containing steps 213–216 is traversed, and operations similar to those described with reference to steps 206–211 are performed. Namely, in step 213, if the data byte pointer (p) is less than or equal to N and if the compression potential sum S(p) is less than or equal to the negative of the first threshold (T) (e.g., −T) for swapping coding schemes, then it is more efficient to code the data within the coding window 108 by employing LZ1 coding. Subroutine 207 is invoked to swap coding schemes accordingly, to code the data within the coding window 108 using LZ1 coding and to shift the contents of the coding window 108 to the next un-encoded data byte as previously described. The compression potential sum S(p) then is adjusted (step 223) and compression potential analysis continues at step 202.

If the compression potential sum S(p) is greater than the negative of the first threshold (T), in step 214, if the data byte pointer (p) is less than or equal to N and the compression potential sum S(p) is greater than or equal to zero, it is more efficient to code the data within the coding window 108 using the current RAW coding scheme. Subroutine 209 is called to perform this function, to shift the contents of the coding window 108 to the next un-encoded data byte, to adjust the compression potential sum S(p) (step 223) and to continue compression potential analysis as previously described.

Assuming the compression potential sum S(p) is less than zero, in step 215, if the end of the coding window 108 is reached (e.g., p=N) and the compression potential sum S(p) is less than or equal to the negative of the second threshold (t), an educated guess is made to swap coding schemes from RAW to LZ1 and to encode the data within the coding window 108 accordingly (e.g., by calling the subroutine 207 as previously described); otherwise, in step 216, if the compression potential sum S(p) is greater than the negative of the second threshold (t), then the subroutine 212 is called to encode only one complete codeword from the start of the coding window 108 in the current RAW coding scheme. Thereafter, the contents of the coding window 108 are shifted to the next un-encoded data byte, the compression potential sum S(p) is adjusted (step 223) and compression analysis continues in step 202.

If in step 216 either the end of the coding window 108 has not been reached or the compression potential sum S(p) is not greater than the negative of the second threshold (t), then analysis of the compression potential sum S(p) of the data bytes within the coding window 108 continues by incrementing the data byte pointer (p), by calculating the compression potential f(B(p)) of another data byte from the raw data byte source 106 and by adding the compression potential f(B(p)) to the compression potential sum S(p) as previously described (step 202).

Steps 217–221 are traversed when, in step 205, the current coding scheme is undetermined (i.e., RESET), such as during system start-up. In step 217, if the data byte pointer (p) is less than or equal to N and the compression potential sum S(p) is less than or equal to the negative of the first threshold (T), then the current coding scheme (e.g., undetermined) is reset to LZ1 by calling subroutine 218.

Subroutine 218, in general, resets the current coding scheme to a coding scheme "X" (e.g., either to LZ1 or to RAW). To reset the coding scheme to coding scheme X, the control code for setting the coding scheme to scheme X is inserted in front of the data byte stream comprising the coding window 108. Thereafter, with the coding scheme set to X, the data bytes within the coding window 108 are coded using coding scheme X, up to the last data byte creating a positive delta in the absolute value of the compression potential sum S(p). The contents of the coding window 108 then are shifted to the next un-encoded data byte supplied from the raw data byte source 106. The subroutine 218 ends by adjusting the compression potential sum S(p) for the encoded data bytes (step 223) and by returning to step 202 to continue compression potential analysis of data within the coding window 108.

Assuming the compression potential sum S(p) is greater than the negative of the first threshold (T), in step 219, if the data byte pointer (p) is less than or equal to N and the compression potential sum S(p) is greater than the positive of the first threshold (T), then subroutine 218 is called to reset the current coding scheme to RAW, to code the p data bytes within the coding window 108, to adjust the compression potential sum S(p) (step 223) and to continue compression potential analysis at step 202 as described; otherwise, control passes to step 220.

In step 220, if the end of the coding window 108 has been reached (e.g., p=N) and the compression potential sum S(p) is less than or equal to zero, subroutine 218 is called to reset the current coding scheme to LZ1, to code the p data bytes within the coding window 108, to adjust the compression potential sum S(p) (step 223) and to continue compression potential analysis as described; otherwise, control passes to step 221.

In step 221, if the end of the coding window 108 has been reached, and the compression potential sum S(p) is greater than zero, subroutine 218 is called to reset the current coding scheme to RAW, to code the p data bytes within the coding window 108, to adjust the compression potential sum S(p) (step 223) and to continue compression potential analysis; otherwise, analysis of the compression potential sum S(p) of the data bytes within the coding window 108 continues with step 202.

In summary, the compression potential of data bytes within the coding window 108 is analyzed by computing the compression potential f(B(p)) of each data byte within the coding window 108, by adding to each data byte's compression potential f(B(p)) to a running compression potential sum S(p) and by determining whether to code the data bytes comprising the compression potential sum S(p) using LZ1 coding or RAW coding based on the value of the compression potential sum S(p), whether the end of the coding window 108 has been reached, and/or the current coding scheme.

Figure 3:
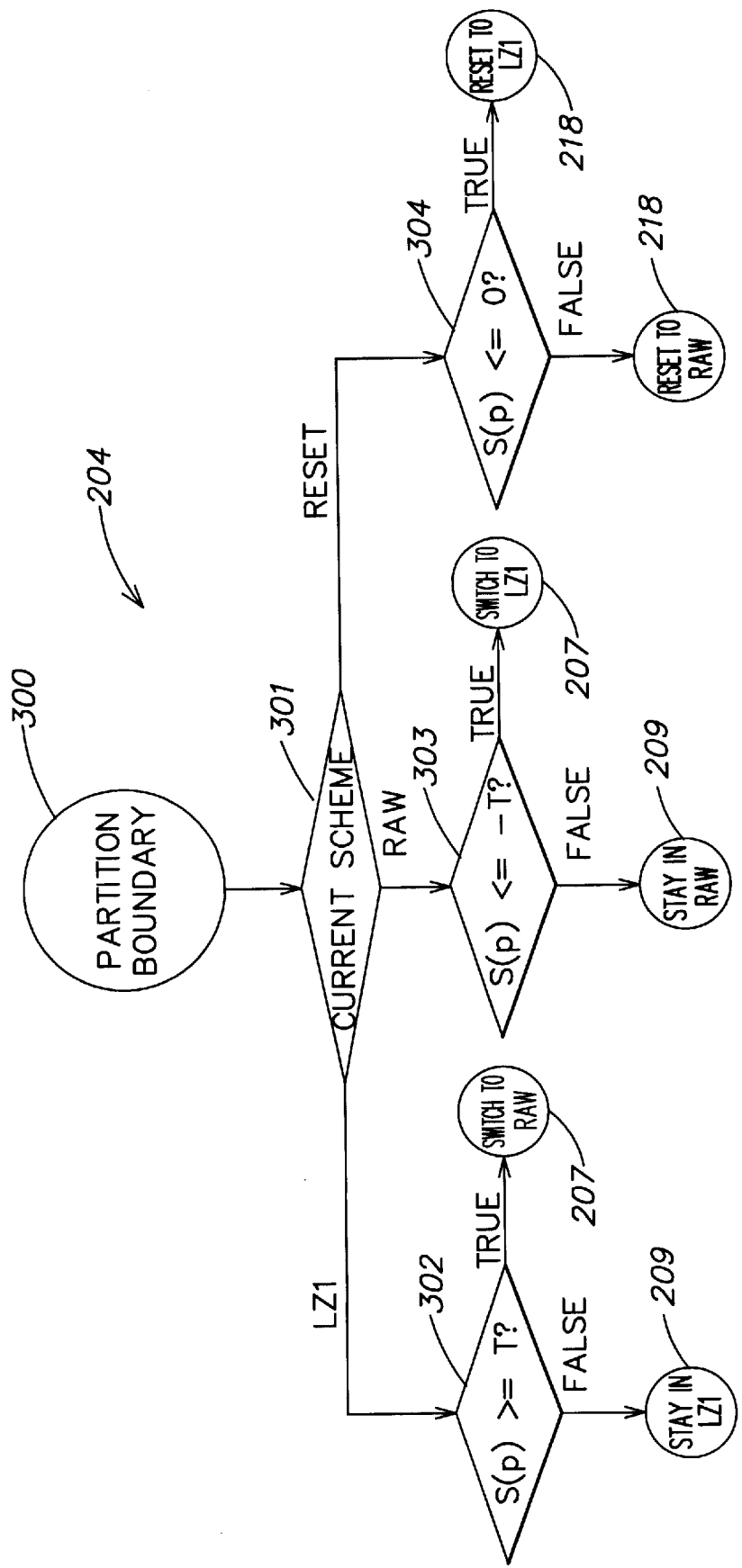
FIG. 3 is a flowchart of a coding subroutine called by the inventive coding selection algorithm of FIG. 2 when the end of a data partition is reached.

FIG. 3 is a flowchart of the subroutine 204 of FIG. 2 for addressing data coding when the end of a data partition is reached. With reference to FIGS. 2 and 3, when a partition boundary is reached during compression potential analysis (e.g., as identified in step 203), the subroutine 204 is called.

Subroutine 204 starts at step 300. In step 301, the current coding scheme is identified. If the current coding scheme is LZ1 coding, then step 302 is executed; if the current coding scheme is RAW coding, then step 303 is executed; or if the current coding scheme is undetermined (e.g., at start-up) then step 304 is executed.

In step 302, if the compression potential sum S(p) is greater than or equal to the first threshold (T), subroutine 207 is called to switch the current coding scheme (e.g., LZ1) to RAW and to code the data within the coding window 108 therewith; otherwise, if the compression potential sum S(p) is less than the first threshold (T), subroutine 209 is called to code the data within the coding window 108 using LZ1 coding.

In step 303, if the compression potential sum S(p) is less than the negative of the first threshold (T), subroutine 207 is called to switch the current coding scheme (e.g., RAW) to LZ1 and to code the data within the coding window 108 therewith; otherwise, if the compression potential sum S(p) is greater than the negative of the first threshold (T), subroutine 209 is called to code the data within the coding window 108 using RAW coding.

In step 304, if the compression potential sum S(p) is less than or equal to zero, subroutine 218 is called to reset the current coding scheme (e.g., undetermined) to LZ1 and to code the data within the coding window 108 therewith; otherwise, if the compression potential sum S(p) is greater than zero, subroutine 218 is called to reset the current coding scheme to RAW and to code the data within the coding window 108 therewith.

Figure 4A:
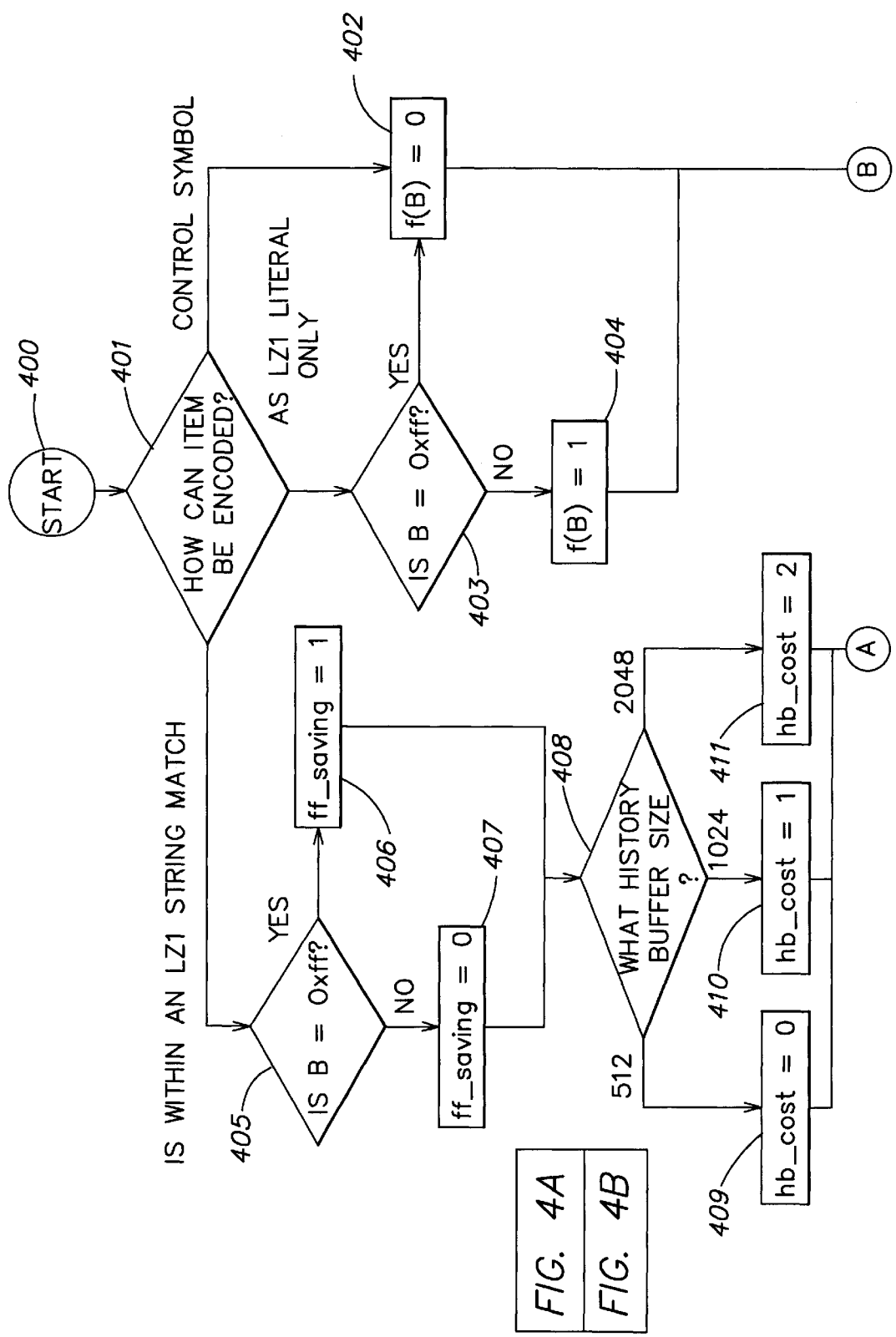
FIGS. 4A–4B are a flowchart of a coding subroutine called by the inventive coding selection algorithm of FIG. 2 for computing the compression potential of a data byte.
Figure 4B:
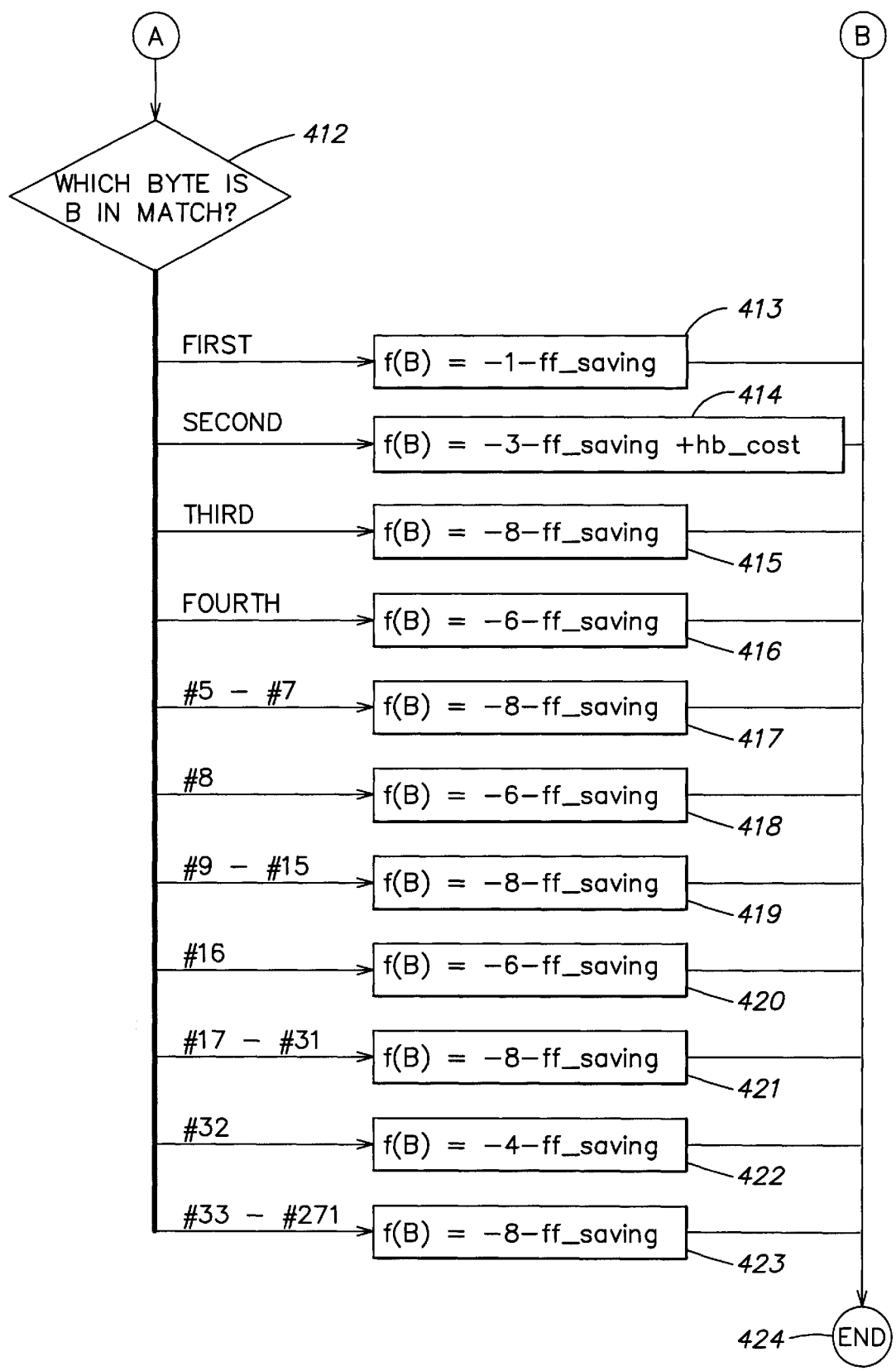

FIG. 4 is a flowchart of the computation of the compression potential f(B(p)) for each data byte (e.g., during step 202 in FIG. 2) within the coding window 108 during the computation of the compression potential sum S(p) or as required to adjust the compression potential sum S(p) (e.g., preferably during at least subroutine 212 as described below). Data byte compression potential computation starts at step 400.

In step 401, a data byte is analyzed to determine if the data byte is within an LZ1 string match (e.g., is encodeable as a copy pointer within the LZ1 coding scheme), is encodeable only as a literal within the LZ1 coding scheme or is a control symbol within the LZ1 coding scheme. If the data byte is a control symbol, the control symbol requires the same number of bits whether encoded in the LZ1 coding scheme or in the RAW coding scheme. As such, the compression potential f(B) for the control symbol is set to zero in step 402 so as to have no affect on the compression potential sum S(p).

If the data byte is encodeable only as a literal within the LZ1 coding scheme, in step 403 a determination is made as to whether the data byte is an 0xff data byte (e.g., requiring an additional bit to distinguish it from a control code). If the data byte is an 0xff data byte, due to the requirement for an extra bit to distinguish the data byte from a control code, the data byte will require the same number of bits whether encoded in the LZ1 or in the RAW coding scheme. As such, if the data byte is an 0xff data byte, the compression potential f(B) is set to zero in step 402 so as to have no affect on the compression potential sum S(p).

When the data byte is not an 0xff data byte, coding the data byte with the RAW coding scheme requires one less bit than coding the data byte with the LZ1 coding scheme. Accordingly, if the data byte is not an 0xff data byte, in step 404, the compression potential f(B) for the data byte is set to one to indicate that it is more favorable to employ RAW coding for the data byte.

If the data byte is within an LZ1 string match, in step 405 a determination is made as to whether the data byte is an 0xff data byte. If the data byte is an 0xff data byte, it is more favorable to encode the data byte using LZ1 coding, and a "savings" variable associated with coding an 0xff data byte using LZ1 coding ("ff-savings") is set to one in step 406; otherwise, if the data byte is not an 0xff data byte, in step 407 ff-savings is set to zero.

In step 408, the history buffer size if examined (e.g., to determine if a 512, 1024 or 2048 byte history buffer is being employed). As history buffer size increases, the number of bits required for each displacement field increases. The cost of coding in LZ1 thus increases with history buffer size, and a history buffer size cost variable ("hb-cost") is set to zero for a 512 byte history buffer (step 409), to one for a 1024 byte history buffer (step 410) and to two for a 2048 byte history buffer (step 411).

In step 412, the byte number that the data byte occupies within the string match is determined. In the preferred embodiment of FIG. 4, a string match of up to 271 data bytes may be analyzed to compute a compression potential f(B) for each data byte therein. It will be understood that other maximum data byte string match lengths may be employed if desired.

In steps 413–423, a compression potential f(B) for the data byte is computed based on the byte number the data byte occupies within the string match, the ff-savings value and for the second data byte within a string match, the hb-cost value. More specifically, for the first data byte within the string match (step 413) and for string match bytes 3–271 (steps 415–423) the compression potential f(B) equals the maximum number of bits that can be saved using LZ1 coding (e.g., based on the length associated with the displacement) plus the ff-savings. For the second data byte (step 414), the compression potential f(B) equals the maximum number of bits that can be saved using LZ1 coding plus the ff-savings and the hb-cost (e.g., to ensure a zero or positive value for f(B) is not inadvertently produced so as to cause the inventive algorithm to inadvertently employ RAW coding).

Once the compression potential f(B) is computed for a data byte in either steps 402, 404 or 413–423, in step 424 data byte compression potential analysis ends for the data byte. The data byte's compression potential f(B) then is added to the compression potential sum S(p) in step 202 as previously described or may be subtracted from the compression potential sum S(p) (e.g., during subroutine 212) as described below.

As previously stated, the inventing coding selection algorithm of FIGS. 2–4 is implementable in either hardware, software or a combination thereof. In software form, the inventive coding selection algorithm may be programmed using any suitable programming language (e.g., C, C++, Pascal, assembly language and the like), and may be implemented as a computer program product carried by a medium readable by a computer (e.g., a carrier wave signal, a floppy disc, a hard drive, a random access memory, etc.).

Figure 5:
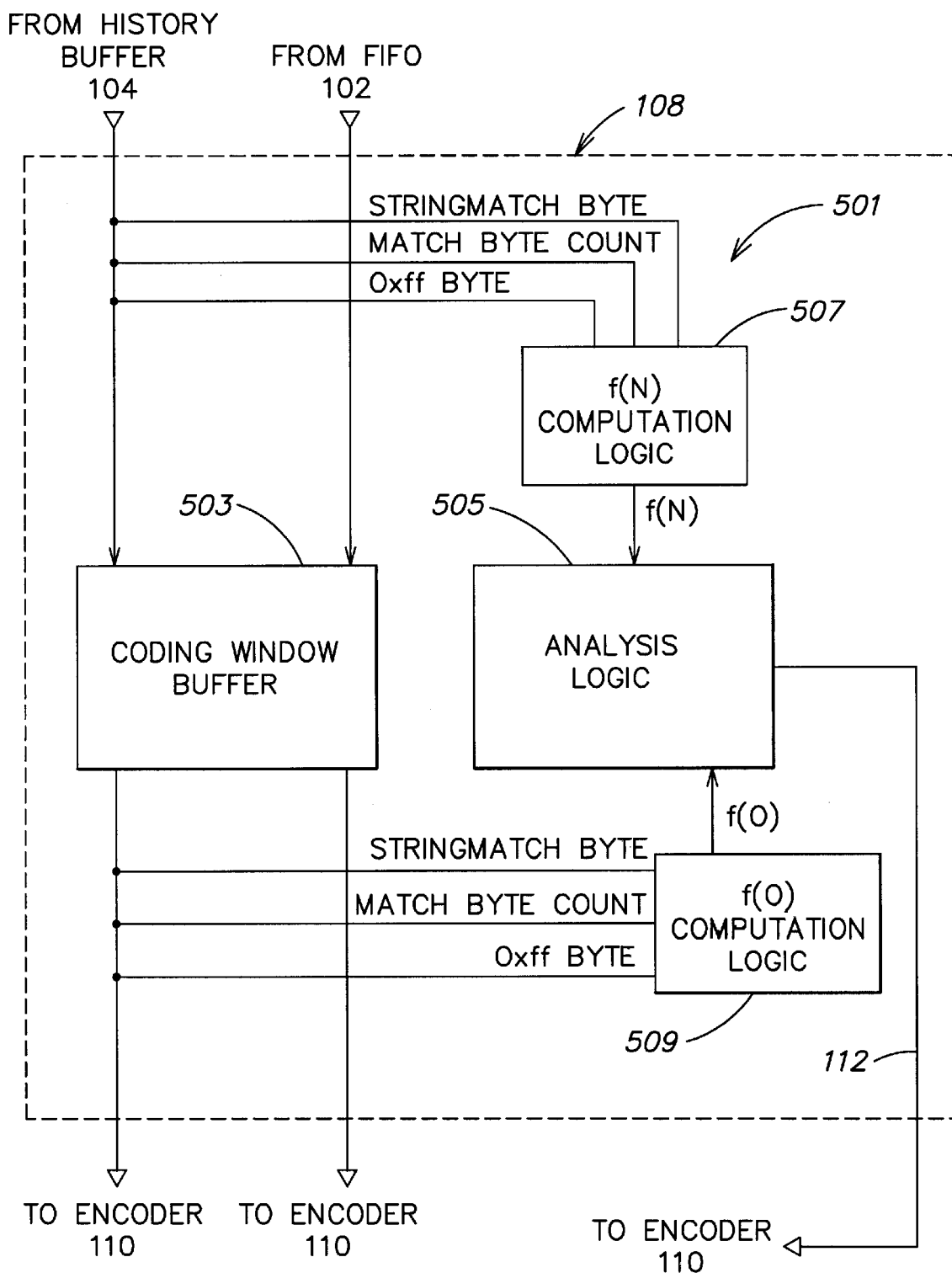
FIG. 5 is a block diagram of a coding window circuit that represents an exemplary hardware implementation of the inventive coding selection algorithm of FIGS. 2–4.

In hardware form, the inventive coding selection algorithm may be implemented using any known circuit elements. FIG. 5 is a block diagram of a coding window circuit 501 that represents an exemplary hardware implementation of the inventive coding selection algorithm of FIGS. 2–4. The coding window circuit 501 comprises a coding window buffer 503 (e.g., preferably a 32, 64 or 128 byte FIFO buffer) coupled to analysis logic 505 via f(N) computation logic 507 and via f(O) computation logic 509. The f(N) computation logic 507 and the f(O) computation logic 509 may comprise any logic suitable for computing the data byte compression potential f(B) in accordance with the algorithm of FIG. 4 (e.g., decoder/adder logic circuitry as is known in the art).

In operation, the coding window circuit 501 receives data bytes and history information from the FIFO 102 and the history buffer 104, respectively. Specifically, the coding window buffer 503 receives and stores data bytes from the FIFO 102 and history information from the history buffer 104, and the f(N) computation logic 507 receives inputs from the history buffer 104 required to calculate the compression potential f(B) for each data byte supplied to the coding window buffer 503. For example, the f(N) computation logic 507 receives a stringmatch byte which indicates whether the most recently received data byte is part of a string match, a matchbyte count which identifies the byte number the most recently received data byte occupies in the string match, and a 0xff byte which identifies whether the most recently received data byte is an 0xff byte. Based thereon, the f(N) computation logic 507 computes the compression potential f(B) for the most recently received data byte in accordance with the algorithm of FIG. 4 (hereinafter "compression potential f(N)"), and supplies the compression potential f(N) to the analysis logic 505. The analysis logic 505 then employs the compression potential f(N) within the inventive coding selection algorithm as previously described.

For each data byte that exits the coding window buffer 503, the f(O) computation logic 509 receives inputs from the coding window buffer 503 required to calculate the compression potential f(B) for the data byte (e.g., a stringmatch byte, a matchbyte count and a 0xff byte). Based thereon, the f(O) computation logic 509 computes the compression potential of the data byte exiting the coding window buffer 503 (hereinafter "compression potential f(O)") using the algorithm of FIG. 4, and supplies the compression potential f(O) to the analysis logic 505. The analysis logic 505 then may employ the compression potential f(O) within the inventive coding selection algorithm to adjust the compression potential sum S(p), preferably during at least the performance of subroutine 212.

Figure 6:
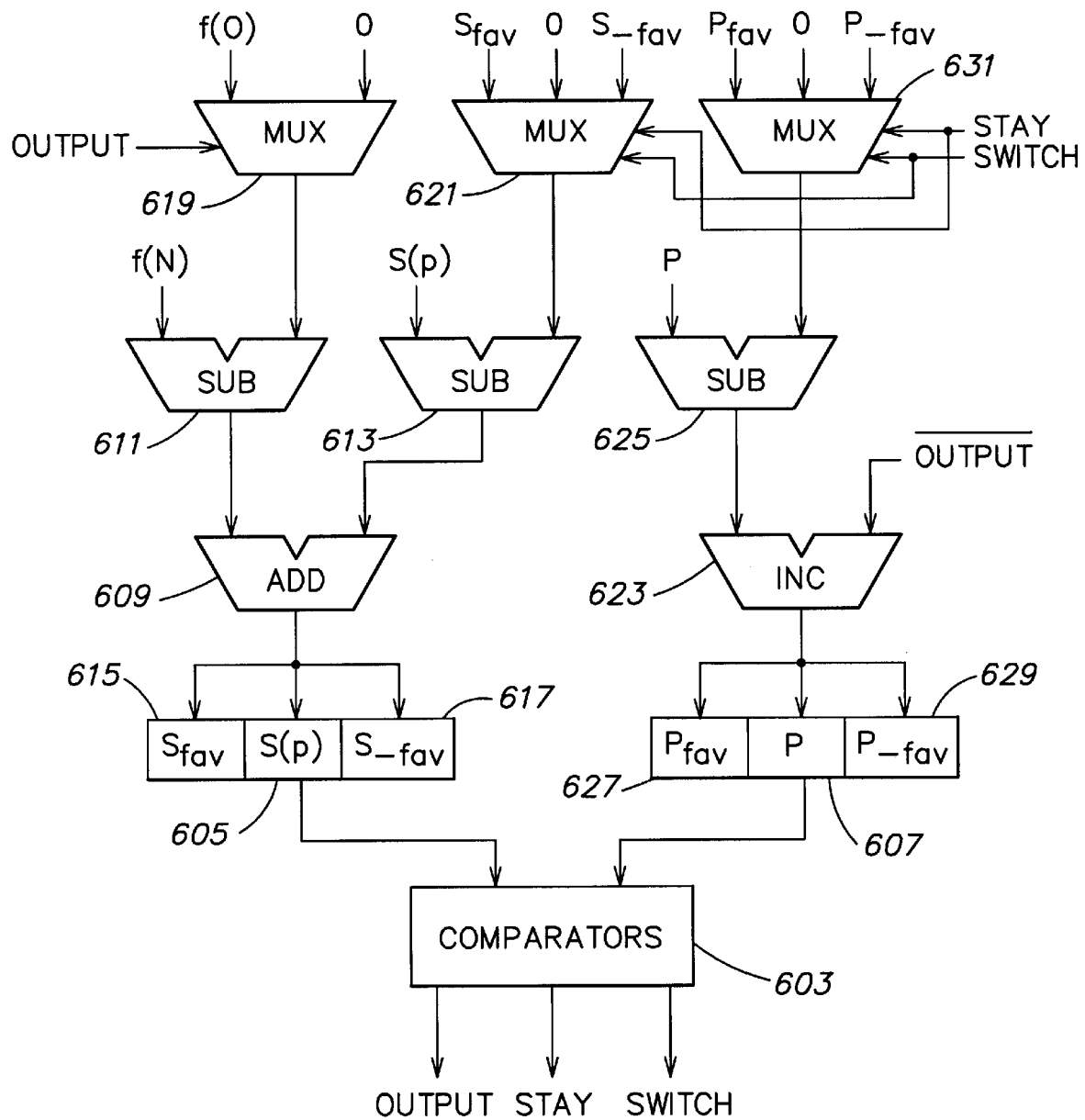
FIG. 6 is a schematic diagram of a preferred embodiment of the analysis logic of FIG. 5.

FIG. 6 is a schematic diagram of analysis logic 601 which represents a preferred embodiment of the analysis logic 505 of FIG. 5. The analysis logic 601 comprises a plurality of comparators 603 having a first input coupled to a compression potential sum S(p) register 605 ("S(p) register 605") and a second input coupled to a coding window byte count register 607 ("P register 607"). In response to these inputs, the plurality of comparators 603 generate an output signal (e.g., in accordance with subroutine 212 of FIG. 2), a stay signal (e.g., in accordance with subroutine 209 of FIG. 2) or a switch signal (e.g., in accordance with subroutine 207 of FIG. 2) as described further below.

The analysis logic 601 further comprises a first adder 609 having a first input coupled to an output of first subtractor 611, a second input coupled to an output of a second subtractor 613, and an output coupled to a first accumulated compression potential sum value register 615 ("$S_{fav}$ register 615"), to a second accumulated compression potential sum value register 617 ("$S_{-fav}$ register 617") and to the S(p) register 605. The first subtractor 611 has a first input coupled to the f(N) computation logic 507 for receiving the compression potential f(N) of each data byte entering the coding window buffer 503 and a second input coupled to an output of a first multiplexer 619. The first multiplexer 619 has a first input coupled to the f(O) computation logic 509 for receiving the compression potential f(O) of each data byte exiting the coding window buffer 503 and a second input coupled to a null input (e.g., 0 volts). An output selection control input of the first multiplexer 619 is coupled to the plurality of comparators 603 so as to receive the output signal supplied therefrom.

The second subtractor 613 has a first input coupled to the S(p) register 605 for receiving the compression potential sum S(p) output therefrom, and a second input coupled to an output of a second multiplexer 621. The second multiplexer 621 has a first input coupled to the $S_{fav}$ register 615 for receiving an accumulated compression potential sum value $S_{fav}$ stored therein, a second input coupled to a null input (e.g., 0 volts) and a third input coupled to the $S_{-fav}$ register 617 for receiving an accumulated compression potential sum value $S_{-fav}$ stored therein. The output selection control inputs of the second multiplexer 621 are coupled to the plurality of comparators 603 so as to receive the stay and switch signals supplied therefrom.

The analysis logic 601 further comprises an incrementor 623 having a first input coupled to an output of a third subtracter 625, a second input coupled to the plurality of comparators 603 (e.g., via an inverter, not shown) so as to receive an inverse of the output signal supplied therefrom and an output coupled to a first data byte count value register ("$P_{-fav}$ register 627"), to a second data byte count value register ("$P_{-fav}$ register 629") and to the P register 607. The third subtracter 625 has a first input coupled to the P register 607 for receiving the coding window count P output therefrom, and a second input coupled to an output of a third multiplexer 631. The third multiplexer 631 has a first input coupled to the $P_{fav}$ register 627 for receiving a data byte count value $P_{fav}$ stored therein, a second input coupled to a null input (e.g., 0 volts) and a third input coupled to the $P_{-fav}$ register 629 for receiving a data byte count value $P_{-fav}$ stored therein. The output selection control inputs of the third multiplexer 631 are coupled to the plurality of comparators 603 so as to receive the stay and switch signals supplied therefrom.

In operation, in accordance with the coding selection algorithm of FIGS. 2–4, the compression potential f(B) is computed for each data byte supplied to the coding window 108 from the FIFO 102 via the f(N) computation logic 507 and is supplied to the first subtracter 611 (as compression potential f(N)). Assuming the end of the coding window has not been reached (e.g., P<N in FIG. 2 or, in terms of the coding window buffer 503, when the coding window buffer 503 contains only data bytes for which a coding decision has not been made) and the compression potential sum S(p) has not reached the first threshold (T), the output, stay and switch signals of the plurality of comparators 603 all are at a low voltage. In response thereto, the multiplexers 619, 621 and 631 each output a null voltage level so that the first subtractor 611 outputs the compression potential f(N) of the current data byte unaltered to the first adder 609, the second subtractor 613 outputs the compression potential sum S(p) unaltered to the first adder 609 and the third subtractor 625 outputs the coding window count P unaltered to the incrementor 623. The first adder 609 adds the compression potential f(N) to the compression potential sum S(p) and the resultant compression potential sum S(p) is stored in the S(p) register 605. Additionally, if the current data byte's compression potential f(N) is "favorable" to the current coding scheme (e.g., is more efficiently compressed using the current coding scheme), the compression potential sum S(p) is stored within the $S_{fav}$ register 615; otherwise the compression potential sum S(p) is stored within the $S_{-fav}$ register 617.

With the output signal of the plurality of comparators 603 low, the incrementor 623 increments the coding window count P and the resultant coding window count is stored in the P register 607. Additionally, if the current data byte's compression potential f(N) is favorable to the current coding scheme, the coding window count is stored within the $P_{fav}$ register 627; otherwise, the coding window count P is stored within the $P_{-fav}$ register 629.

The compression potential sum S(p) stored within the S(p) register 605 and the coding window count P stored within the P register 607 are supplied to the plurality of comparators 603, and in accordance with the coding selection algorithm of FIG. 2, the plurality of comparators 603 determine if any of the threshold conditions (e.g., the first threshold (T), the end of the coding window and the second threshold (t), etc.) have been reached. If so, the appropriate signal is supplied by the plurality of comparators 603 (e.g., an output signal, a stay signal or a switch signal) to the encoder 110 via the scheme selection control line 112 and the encoder 110 is employed to perform the appropriate coding operation in accordance with subroutine 207, 209, 212 or 218 as previously described.

If a high output signal is generated by the plurality of comparators 603 (e.g., during subroutine 212), the compression potential f(O) of each data byte exiting the coding window buffer 503 (computed via the f(O) computation logic 509 and supplied to the first subtractor 611 through the first multiplexer 619) is subtracted from the compression potential f(N) of each new data byte entering the coding window buffer 503 (computed via the f(N) computation logic 507) during the output operation (e.g., via the first subtractor 611). In this manner, the compression potential f(O) of each data byte exiting the coding window buffer 503 is effectively subtracted from the compression potential sum S(p) when the compression potential f(N) is added to the compression potential sum S(p) by the first adder 609. The incrementor 623 is disabled during this time period so that coding window count P remains constant as required.

If a high stay signal is generated by the plurality of comparators 603 (e.g., during subroutine 209), the compression potential sum value $S_{fav}$ of $S_{fav}$ register 615 is passed through the second multiplexer 621 to the second subtractor 613, and the second subtractor 613 subtracts the compression potential sum value $S_{fav}$ from the compression potential sum S(p). In this manner, the compression potential sum S(p) is adjusted for the compression potential sum contributions due to the data bytes removed from the coding window buffer 503 and encoded during the stay subroutine 209. To adjust the coding window count P for the data bytes removed from the coding window buffer 503 and encoded during the stay subroutine 209, the data byte count value $P_{fav}$ stored within the $P_{fav}$ register 627 is passed to the third subtractor 625 through the third multiplexer 631, and is subtracted from the coding window count P by the third subtractor 625.

If a high switch signal is generated by the plurality of comparators 603 (e.g., during subroutine 207 or during subroutine 218), the compression potential sum value $S_{-fav}$ of the $S_{-fav}$ register 617 is passed through the second multiplexer 621 to the second subtractor 613, and the second subtractor 613 subtracts the compression potential sum value $S_{-fav}$ from the compression potential sum S(p). The compression potential sum S(p) thereby is adjusted for the compression potential sum contributions due to the data bytes removed from the coding window buffer 503 and encoded during the switch subroutine 207 or during the reset subroutine 218. To adjust the coding window count P for the data bytes removed from the coding window buffer 503 and encoded during the switch subroutine 207 or during the reset subroutine 218, the data byte count value $P_{-fav}$ stored within the $P_{-fav}$ register 629 is passed to the third subtractor 625 through the third multiplexer 631, and is subtracted from the coding window count P by the third subtractor 625.

By thus analyzing the compression potential of data prior to coding, and by selecting an appropriate coding scheme based thereon, data compression may be performed with the potential for minimal data expansion. Because the compression potential sum is set to a new compression potential sum (e.g., is adjusted) based upon the compression potential of data exiting the coding window, the inventive coding selection algorithm may be easily implemented in hardware.

The foregoing description discloses only the preferred embodiments of the invention, modifications of the above disclosed apparatus and method which fall within the scope of the invention will be readily apparent to those of ordinary skill in the art. For instance, while the present invention has been described with reference to LZ1 coding, other coding schemes may be employed. Other values for the first and second thresholds may be used if desired, as may other coding window sizes, history buffer sizes and compression potential weighting. Further, while the present invention has been described with reference to LZ1 and pass-through (RAW) coding, it will be understood that other combinations of two or more coding schemes may be employed. As used herein, a "data byte" means any data set comprising one or more bits and should not be limited to the conventional definition of eight bits.

Accordingly, while the present invention has been disclosed in connection with the preferred embodiments thereof, it should be understood that other embodiments may fall within the spirit and scope of the invention, as defined by the following claims.

The invention claimed is:

1. A method used in a data compression process having two or more coding schemes, the method comprising:

providing a coding window used to hold a sequence of p bytes of data, that allows analysis of the compression potential of each byte of the sequence of p bytes of data held therewithin, wherein the coding window has a dynamically variable size p, wherein p is an integer number of bytes in the sequence and p is not greater than a predetermined maximum size N;

calculating a compression potential sum Sp of data within the coding window, according to the formula:

$$S_p = \sum_{n=1}^{p} f(W[n])$$

wherein f(W[n]) equals the compression potential of the nth data byte within the coding window;

swapping the coding scheme used to encode the data exiting the window from one scheme to another coding scheme when the absolute value of the compression potential sum (|Sp|) of data within the window reaches a first threshold T; and reducing the size p of the coding window by a count of the bytes exiting the window and setting a new compression potential sum based upon the compression potential of data exiting the window.

2. The method of claim 1 wherein N is selected from the group consisting of 32 bytes, 64 bytes and 128 bytes.

3. The method of claim 1 wherein f(W[n]) for the nth data byte within the coding window is computed based upon the byte number (LZStringMatchByteNumber) that said nth data byte within the coding window occupies within a Lempel-Ziv string match, and also upon the ff_savings value (ff_saving), and if the nth byte is the second data byte within a string match (LZStringMatchByteNumber=2) then also upon the hb_cost value (hb_cost);

and wherein f(W[n]) for the nth data byte within the coding window is equal to −1-ff_saving if the nth data byte within the coding window is the first data byte within the Lempel-Ziv string match (if LZStringMatchByteNumber=1, then f(W[n])=−1-ff_saving); and and wherein f(W[n]) for the nth data byte within the coding window is equal to −3-ff_saving+hb_cost if the nth data byte within the coding window is the second data byte within the Lempel-Ziv string match (if LZStringMatchByteNumber=2, then f(W[n])=−3-ff_saving+hb_cost).

4. The method of claim 1 wherein the compression potential sum Sp of data within the coding window comprises a running total of the compression potential of each byte of data entering the coding window minus the compression potential of each byte of data exiting the coding window.

5. The method of claim 1 wherein the first threshhold T is a programmable value.

6. The method of claim 1 wherein calculating a compression potential sum Sp of data within the coding window comprises:

a) calculating a data byte compression potential for a new data byte entering the coding window; and wherein swapping the coding scheme used to compress the data within the window from one scheme to another when the first threshold T is reached comprises:

b) adding the new data byte's compression potential to the compression potential sum Sp; and c) swapping the coding scheme used to encode the data within the window from one scheme to another when the absolute value of the compression potential sum (|Sp|) reaches the first threshhold T.

7. The method of claim 6 wherein setting a new compression potential sum based upon the compression potential of data exiting the window comprises:

d) subtracting the compression potential of each data byte exiting the coding window or subtracting an accumulated compression potential sum value from the compression potential sum Sp.

8. The method of claim 6 further comprising:

d) swapping the coding scheme used to encode the data within the window from one scheme to another scheme if both the compression potential sum reaches a second threshhold tt and the size p of the coding window equals N.

9. The method of claim 8 wherein the second threshhold tt is a programmable value.

10. The method of claim 8 further comprising:

e) swapping the coding scheme used to encode the data within the window from one scheme to another scheme if both the compression potential sum reaches the first threshhold T and a partition boundary of the data has been reached.

11. The method of claim 10 further comprising:

f) repeating a)–e) if none of the following conditions exists:

1) the coding scheme used to encode the data exiting the coding window is swapped from one scheme to another;

2) the size p of the coding window equals N; or 3) a partition boundary of the data is reached.

12. The method of claim 11 wherein setting a new compression potential sum based upon the compression potential of data exiting the window comprises:

g) subtracting the compression potential of each data byte exiting the coding window from the compression potential sum.

13. The method of claim 1 further comprising compressing the data exiting the coding window.

14. A coding window circuit adapted to allow the analysis of the compression potential sum of p non-encoded bytes of data stored within a coding window, the coding window circuit comprising:

a coding window buffer adapted to store p data bytes supplied to the coding window circuit, wherein p is less than or equal to N, wherein N is the size of the coding window buffer;

a first calculation circuit coupled to the coding window buffer and adapted to compute the compression potential of each data byte entering the coding window buffer;

a second calculation circuit coupled to the first calculation circuit and adapted to compute a compression potential sum based on the computed compression potentials of each of p data bytes within the coding window buffer;

a comparison circuit coupled to the second calculation circuit and adapted to compare the computed compression potential sum to a first predetermined value T and to generate a signal that swaps the coding scheme used to encode data bytes exiting the coding window buffer from one scheme to another when the absolute value of the compression potential sum is equal to or greater than the first predetermined value T; and a third calculation circuit coupled to the second calculation circuit and adapted to reduce the absolute value of the compression potential sum based on the compression potential of each data byte exiting the coding window buffer.

15. The coding window circuit of claim 14 wherein the comparison circuit is further adapted to determine if the coding window buffer contains N bytes and the coding window buffer contains only data bytes for which a coding decision has not been made, and if so, to generate a signal that swaps the coding scheme used to encode data bytes exiting the coding window buffer from one scheme to another scheme if the absolute value of the compression potential sum reaches the second predetermined value tt.

16. The coding window circuit of claim 14 wherein the coding window buffer comprises a buffer selected from the group consisting of a 32-byte buffer, a 64-byte buffer and a 128-byte buffer.

17. The coding window circuit of claim 14 wherein the third calculation circuit comprises:

a multiplexer adapted to selectively output one of a plurality of accumulated compression potential sum values; and a subtraction circuit coupled to the multiplexer and to the second calculation circuit and adapted to subtract an accumulated compression potential sum value supplied by the multiplexer from a compression potential sum computed by the second calculation circuit.

18. The coding window circuit of claim 17 wherein the accumulated compression potential sum values comprise:

a first compression potential sum value having a null value;

a second compression potential sum value representative of the compression potential sum contributions of data bytes for which a current coding scheme is employed to encode the data bytes; and a third compression potential sum value representative of the compression potential sum contributions of data bytes for which a swapped coding scheme is employed to encode the data bytes.

19. The coding window circuit of claim 14 further comprising a coding window size circuit coupled to the comparison circuit and adapted to compute a coding window data byte count p equaling the number of data bytes present within the coding window buffer for which a coding decision has not been made.

20. The coding window circuit of claim 19 wherein the coding window size circuit comprises:

a multiplexer adapted to selectively output one of a plurality of data byte count values;

a subtraction circuit coupled to the multiplexer and adapted to subtract a data byte count value supplied by the multiplexer from the coding window data byte count; and an incrementor circuit coupled to the subtraction circuit and to the comparison circuit and adapted to increment the coding window data byte count when a data byte is added to the coding window buffer of the coding window circuit.

21. The coding window circuit of claim 20 wherein the data byte count values comprise:

a first data byte count value having a null value;

a second data byte count value representative of the number of data bytes within the coding window buffer for which a current coding scheme is employed to encode the data bytes; and a third data byte count value representative of the number of data bytes within the coding window buffer for which a swapped coding scheme is employed to encode the data bytes.

22. A coding window circuit for use in a data compression process having two or more coding schemes, the circuit comprising:

coding window means for holding p bytes of data to be encoded, wherein p is a dynamically variable size less than or equal to N bytes, wherein N is a predetermined maximum size;

calculating means coupled to the coding window means for calculating a compression potential of data entering the coding window means;

analysis means coupled to the calculating means for computing a compression potential sum based on the compression potential of each byte of data entering the coding window means;

comparison means coupled to the analysis means for generating a signal that swaps the coding scheme used to encode the data exiting the coding window means from one scheme to another when the absolute value of the compression potential sum of the p data bytes within the coding window means is equal to or greater than a first threshhold T; and compression potential sum adjustment means coupled to the analysis means for setting a new compression potential sum based upon the compression potential of data exiting the coding window means.

23. The coding window circuit of claim 22 wherein the calculating means comprises:

a first calculation circuit coupled to the coding window means for computing the compression potential of data entering the coding window means; and a second calculation circuit coupled to the coding window means for computing the compression potential of data exiting the coding window means.

* * * * *